United States Patent [19]

Delagrange

[11] 3,904,971

[45] Sept. 9, 1975

[54] AUTOMATIC GAIN CONTROL AMPLIFIER CIRCUIT

[75] Inventor: Arthur D. Delagrange, Sykesville, Md.

[73] Assignee: The United States of America as represented by the Secretary of the Navy, Washington, D.C.

[22] Filed: June 6, 1974

[21] Appl. No.: 477,112

Related U.S. Application Data

[62] Division of Ser. No. 184,903, Sept. 29, 1971.

[52] U.S. Cl. .................. 330/29; 330/138; 330/141; 330/145

[51] Int. Cl.$^2$ .......................................... H03G 7/06

[58] Field of Search ....... 330/29, 35, 138, 141, 145; 325/410, 413, 319

[56] References Cited

UNITED STATES PATENTS

| | | | |
|---|---|---|---|
| 3,109,993 | 11/1963 | Blair | 330/145 X |
| 3,441,748 | 4/1969 | Werner | 330/145 UX |
| 3,533,006 | 10/1970 | Kubicz | 330/145 X |
| 3,539,826 | 11/1970 | Crouse | 330/145 X |
| 3,581,223 | 5/1971 | Armstrong | 330/29 |
| 3,723,897 | 3/1973 | Barnes | 330/29 |

FOREIGN PATENTS OR APPLICATIONS

| | | | |
|---|---|---|---|
| 1,231,305 | 12/1966 | Germany | 330/29 |

OTHER PUBLICATIONS

Knighton, "Single Transistor Rectifies Arc Signal," *Electronics*, Jan. 8, 1968, p. 90.

*Primary Examiner*—James B. Mullins
*Attorney, Agent, or Firm*—R. S. Sciascia; J. A. Cooke; Sol Sheinbein

[57] ABSTRACT

An automatic gain control amplifier circuit employing a field effect transistor as the gain control element and providing normalized signals for slow varying signals while passing those signals that change rapidly relative to its time constant.

1 Claim, 1 Drawing Figure

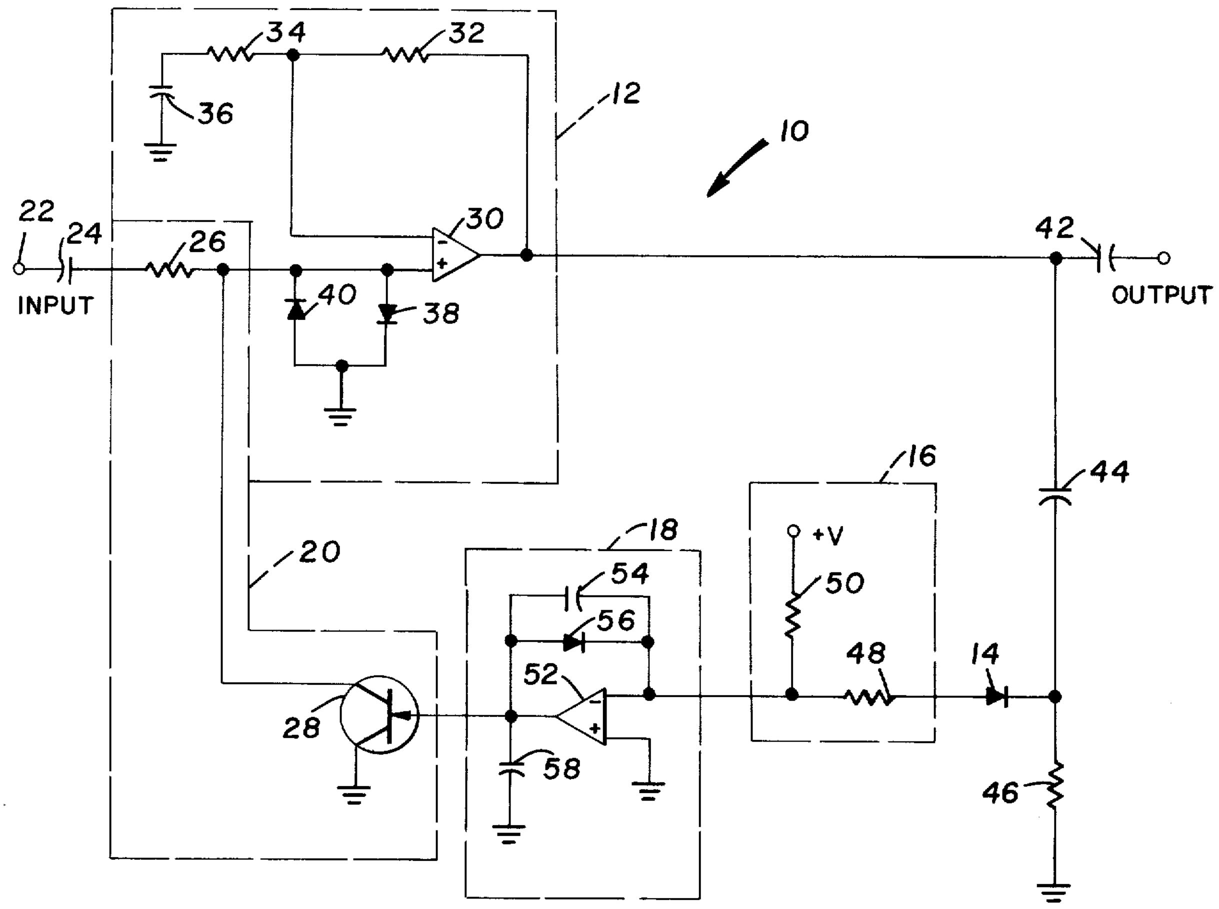
INPUT
OUTPUT
+V
10
12
14
16
18
20
22
24
26
28
30
32
34
36
38
40
42
44
46
48
50
52
54
56
58

AUTOMATIC GAIN CONTROL AMPLIFIER CIRCUIT

CROSS REFERENCE TO RELATED APPLICATIONS

This application is a divisional of application Ser. No. 184,903 filed Sept. 29, 1971.

BACKGROUND OF THE INVENTION

This invention relates generally to an automatic gain control amplifier and more specifically to an automatic gain control device utilizing semiconductor components.

An automatic gain control (hereinafter AGC) is a device whose purpose as to amplify an electronic signal with varying gain such that the amplitude of the signal at the output remains virtually constant even if the input varies over a wide range.

AGC amplifiers were originally made with vacuum tube pentodes. The AC gain of a pentode stage was made to vary by changing the DC bias to operate at a different point of the tube characteristic. When semiconductors became available transistor amplifying stages were used in a similar manner. Use of the ordinary transistor as the gain-control element has several disadvantages. The voltage swing at the input of the transistor must be limited to about 0.1 Volt. The maximum gain of the stage normally depends on the transistor used. Changing the gain of the stage necessitates changing the DC bias of the stage; this sends a transient through the rest of the system which may cause problems.

SUMMARY OF THE INVENTION

Accordingly, one object of the present invention is to provide a new and improved automatic gain control amplifier circuit.

Another object of the present invention is to provide an automatic gain control amplifier circuit to normalize slow varying input signals while passing unaffected rapidly changing signals.

Still another object of the present invention is to provide an automatic gain control circuit employing a field effect transistor.

Yet another object of the present invention is to provide an automatic gain controlled amplifier circuit having a low output impedance and not supplying transients or distortion at its output.

Briefly, these and other objects of the present invention are attained by providing an automatic gain controlled circuit wherein the input signal is fed to a variable attenuator to be amplified by a fixed gain amplifier. A rectifier senses the output amplitude and supplies a rectified and threshold detected signal to an integrator which controls the variable attenuator whereby the output amplitude remains constant even with variations in the input amplitude. The integrator has a time constant such that only slowly varying signals relative to the time constant produce an integrator output while rapidly fluctuating signals do not affect it and are passed through the automatic gain control circuit unnormalized.

BRIEF DESCRIPTION OF THE DRAWINGS

A more complete understanding of the invention and many of the attendant advantages thereof will be readily appreciated as the same becomes better understood by reference to the following detailed description when considered in connected with the accompanying drawings wherein:

The FIGURE is a schematic view of the automatic gain control amplifier circuit according in the present invention.

DESCRIPTION OF THE PREFERRED EMBODIMENTS

Referring now to the FIGURE, automatic gain control (AGC) preamplifier 10 is shown as comprising a fixed gain operational amplifier circuit 12, a rectifier 14, a threshold circuit 16, an integrator circuit 18, and a variable attenuation circuit 20. Briefly, the circuit operates as follows: The input signal at terminal 22 is fed to variable attenuator 20 whose output signal is amplified by fixed gain amplifier 12. The amplifier output is sensed by rectifier 14 and the rectified signal is threshold-detected by threshold detector 16 and fed into integrator 18. The output of integrator 18 controls variable attenuator 20. If the output signal from AGC preamplifier 10 is too large, a voltage is developed greater than the threshold. Consequently, the output of integrator 18 changes in such a manner as to increase the attenuation of variable attenuator 20, which in turn reduces the input signal fixed gain amplifier 12. This process continues until the output of AGC preamplifier 10 is reduced to the proper amplitude. Similarly, if the output becomes too small, the reverse process occurs and the gain is increased, bringing the output up to the proper amplitude. Integrator 18 has a time constant such that only signals that are constant in amplitude or signals that vary slowly relative to this time constant produce an output from the integrator and are normalized, while rapidly fluctuating signals do not effect the integrator and are thus passed to the output of AGC preamplifier without being normalized.

The input signal at terminal 22 is first passed through a capacitor 24 to remove any d.c. signals and then applied to the variable attenuator 20 which may comprise a resistor 26 and the source to drain circuit of an n-channel field effect transistor (FET) 28, the latter of which acts as a variable resistor. Resistor 26 is connected between capacitor 24 and the non-inverting input of a conventional operational amplifier 30, while FET 28 is connected between the non-inverting operational amplifier input and ground. Thus, resistor 26 and FET 28 form a voltage divider attenuator.

The gain of fixed gain amplifier 12 is determined in the conventional manner by the ratio of a feedback resistor 32, connected between the output and inverting input of operational amplifier 30, to an input resistor 34. For example, resistor 32 may be 1 megohm and capacitor 36 couples resistor 34 to ground for a.c. signals only to minimize any d.c. effect at the output of operational amplifier 30 due to offset between its two inputs. A pair of oppositely connected diodes 38 and 40 are connected between the non-inverting input of operational amplifier 30 and ground to limit the input signal, to protect the operational amplifier. The output of fixed gain amplifier 12 is coupled to the output of preamplifier 10 through a capacitor 42 to remove any d.c. offset.

The output of fixed gain amplifier 12 is a.c. coupled by a capacitor 44 and a resistor 46 to diode 14 to remove any d.c. in the feedback loop and rectified by diode 14. Threshold circuit 16 comprises a resistor 48 connected between the anode of diode 14 and the input of integrator 18, and a resistor 50 connected between a source of positive potential +V and the input to integrator 18. Integrator 18 comprises a conventional operational amplifier 52 having its inverting input connected to resistors 48 and 50 and its non-inverting input connected to ground. An integrating capacitor 54 and a diode 56 are connected between the inverting input and output of operational amplifier 52.

Positive potential +V produces a positive bias at the inverting input of operational amplifier 52 that results in a negative output voltage from operational amplifier 52. This negative voltage applied to the gate of FET 28 is sufficient to keep FET 28 "pinched-off" and consequently its source to drain resistance is high. Consequently, there is little attenuation of the input signal by attenuator 20. If the input signal to AGC preamplifier 10 becomes very strong, the output voltage from fixed gain amplifier 12 increases sufficiently to make the average current through resistor 48 and diode 14 greater than the current through resistor 50. Consequently, the output voltage of integrator 18 goes more positive. When this voltage reaches the "pinch-off" voltage of FET 28, its source to drain resistance lowers, thereby increasing the attenuation of the input signal and maintaining the output signal from fixed gain gain amplifier 12 at the desired normalized level. A capacitor 58 connected between the output of integrator 18 and ground prevents input signal leak-through from affecting operational amplifier 52. Diode 56 prevents operational amplifier 52 from over-driving FET 28.

AGC preamplifier 10 has several advantages over previous designs. Due to the negative feedback loop, FET 28 has a constant a.c. voltage across it independent of the input voltage so that distortion does not occur, even at input amplitudes of several volts. FET 28 requires no d.c. bias in the signal path so that attenuation changes do not produce a d.c. shift across it and consequently, no transients are observed at the output of AGC preamplifier 10. By having FET 28 at the non-inverting input of operational amplifier 30, the loop gain of operational amplifier 30 is independent of attenuation, so that compensation for operational amplifier 30 is optimum under all conditions. Futhermore, the use of an operational amplifier with negative feedback gives an inherently low output impendance so the output amplitude is not affected by loading. Finally, the maximum gain is set by operational amplifier 30 and is not affected by the characteristic of FET 28.

It is therefore seen that there has been supplied an automatic gain control which does not affect those signals that change rapidly relative to the time constant of the AGC preamplifier. Signals that are constant in amplitude or signals that vary slowly to the AGC time constant are normalized by the AGC preamplifier.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An automatic gain control amplifier circuit comprising:

variable attenuator means including the source to drain circuit of an n-channel field effect transistor acting as a variable resistor and a resistor forming a voltage divider with said field effect transistor for variably attenuating an input electrical signal;

a fixed gain amplifier including a first operational amplifier including a pair of oppositely connected diodes connected between the non-inverting input of said first operational amplifier and ground, said first operational amplifier having its non-inverting input coupled to the output of said variable attenuator means for generating an output signal from said automatic gain control amplifier circuit;

a diode for rectifying the output of said fixed gain amplifier;

threshold detecting means for generating an output signal when the output of said diode is greater than a predetermined amplitude; and integrating means including a second operational amplifier coupled to the output of said threshold detecting means for integrating the output of said threshold detecting means with respect to time for controlling the attenuation of said field effect transistor, and an integrating capacitor and a diode connected between the inverting input and output of said second operational amplifier, wherein said integrating means has a time constant such that only slowly varying signals are attenuated while rapidly fluctuating signals do not affect said integrating means.

* * * * *